(12) United States Patent
Yang et al.

(10) Patent No.: US 11,968,788 B2
(45) Date of Patent: Apr. 23, 2024

(54) FIXING BELT OF WEARABLE DEVICE, METHOD FOR MANUFACTURING THE SAME, AND WEARABLE DEVICE

(71) Applicants: Avary Holding (Shenzhen) Co., Limited., Shenzhen (CN); QING DING PRECISION ELECTRONICS (HUAIAN) CO., LTD, Huai an (CN); GARUDA TECHNOLOGY CO., LTD., New Taipei (TW)

(72) Inventors: Yong-Quan Yang, Qinhuangdao (CN); Han-Pei Huang, Hsinchu (TW)

(73) Assignees: Avary Holding (Shenzhen) Co., Limited., Shenzhen (CN); QING DING PRECISION ELECTRONICS (HUAIAN) CO., LTD, Huai an (CN); GARUDA TECHNOLOGY CO., LTD., New Tainei (TW)

( * ) Notice: Subject to any disclaimer, the term of this patent is extended or adjusted under 35 U.S.C. 154(b) by 481 days.

(21) Appl. No.: 17/333,274

(22) Filed: May 28, 2021

(65) Prior Publication Data
US 2022/0338356 A1    Oct. 20, 2022

(30) Foreign Application Priority Data

Apr. 16, 2021    (CN) .......................... 202110413574.1

(51) Int. Cl.
*H05K 1/02*    (2006.01)
*H05K 1/18*    (2006.01)
(Continued)

(52) U.S. Cl.
CPC .......... *H05K 3/4644* (2013.01); *H05K 1/028* (2013.01); *H05K 1/0298* (2013.01); *H05K 1/189* (2013.01);
(Continued)

(58) Field of Classification Search
CPC .... H05K 3/4644; H05K 1/028; H05K 1/0298; H05K 3/303; H05K 2201/0364;
(Continued)

(56) References Cited

U.S. PATENT DOCUMENTS

2007/0126123 A1*  6/2007  Sawachi ............. H05K 3/4691
                                                        257/777
2009/0229876 A1*  9/2009  Takahashi ........... H05K 3/4691
                                                        174/254
(Continued)

FOREIGN PATENT DOCUMENTS

CN          105982403 A    10/2016

*Primary Examiner* — Steven T Sawyer
(74) *Attorney, Agent, or Firm* — ScienBiziP, P.C.

(57) ABSTRACT

A method for manufacturing a fixing belt for a wearable device, includes providing a flexible circuit board including a first area, a second area, and a pad in the first area; disposing an insulating layer on the flexible circuit board, the insulating layer being disposed in the second area; forming an electric conductive portion in the insulating layer; disposing a first protective layer and a second protective layer on opposite surfaces of the flexible circuit board, the electric conductive portion being between the flexible circuit board and the first protective layer; mounting an electronic component on the pad. A portion of the fixing belt containing the second area is a plug-in area, and the plug-in area is configured to be engaged with a device body of the wearable device, the electric conductive portion is disposed in the plug-in area.

15 Claims, 12 Drawing Sheets

(51) Int. Cl.
*H05K 3/30* (2006.01)
*H05K 3/46* (2006.01)

(52) U.S. Cl.
CPC ..... *H05K 3/303* (2013.01); *H05K 2201/0364* (2013.01); *H05K 2201/05* (2013.01)

(58) Field of Classification Search
CPC ... H05K 2201/0145; H05K 2201/0154; H05K 3/3436; H05K 2203/1327; H05K 3/284; H05K 1/189; H05K 1/111; H05K 1/0296; H05K 1/181; H05K 3/301; H05K 3/4007; H05K 2201/05; H05K 2201/10189; H05K 1/118; H05K 1/147; H05K 1/148; H05K 1/142; H05K 2201/058; H05K 2201/09109; H05K 2201/0919; A44C 5/00

See application file for complete search history.

(56) References Cited

U.S. PATENT DOCUMENTS

| | | | | |
|---|---|---|---|---|
| 2009/0285580 A1* | 11/2009 | Yasuda | ................ | G02B 6/4284 |
| | | | | 398/139 |
| 2010/0134995 A1* | 6/2010 | Strickland | .............. | H05K 3/365 |
| | | | | 361/792 |
| 2011/0124155 A1* | 5/2011 | Yang | ................... | H01L 23/5385 |
| | | | | 438/107 |
| 2015/0380848 A1* | 12/2015 | Kato | .................... | H05K 3/4635 |
| | | | | 439/67 |
| 2020/0178389 A1* | 6/2020 | Min | ..................... | H05K 3/4691 |
| 2021/0013578 A1* | 1/2021 | Huber | .................... | H05K 1/119 |

\* cited by examiner

US 11,968,788 B2

FIXING BELT OF WEARABLE DEVICE, METHOD FOR MANUFACTURING THE SAME, AND WEARABLE DEVICE

FIELD

The disclosure relates to wearable devices, and more particularly, to a fixing belt of a wearable device, a method for manufacturing the fixing belt, and a wearable device having the fixing belt.

BACKGROUND

Wearable devices such as smart bracelets, can record real-time data relating to sport exercise, sleep, and diet in daily lives. The data can be synchronized to a terminal device for analysis.

However, the limited size of the wearable device also limits the number of functional components that can be integrated on the wearable device, which in turn, may restrict the wearable devices become more multifunctional.

BRIEF DESCRIPTION OF THE DRAWINGS

Many aspects of the disclosure can be better understood with reference to the following drawings. The components are not necessarily drawn to scale, the emphasis instead being placed upon clearly illustrating the principles of the disclosure.

DETAILED DESCRIPTION

Implementations of the disclosure will now be described, by way of embodiments only, with reference to the drawings. It should be noted that the embodiments and the features of the present disclosure can be combined without conflict. Specific details are set forth in the following description to make the present disclosure to be fully understood. The embodiments are only some and not all the embodiments of the present disclosure. Based on the embodiments of the present disclosure, other embodiments obtained by a person of ordinary skill in the art without creative efforts shall be within the scope of the present disclosure.

Unless defined otherwise, all technical and scientific terms used herein have the same meaning as commonly understood by one of ordinary skill in the art. The terms used herein in the specification of the present disclosure are only for describing the embodiments, and are not intended to limit the present disclosure. The term "and/or" as used herein includes any combination of one or more related items.

In the embodiments of the present disclosure, and not as a limitation of the present disclosure, the term "connection" used in the specification and claims of the present disclosure is not limited to physical or mechanical connection, no matter direct connection or indirect connection. The terms of "up", "down", "above", "below", "left", "right", etc., are only used to indicate the relative position relationship. When the absolute position of a described element changes, the relative positions correspondingly changes.

Figure 13:
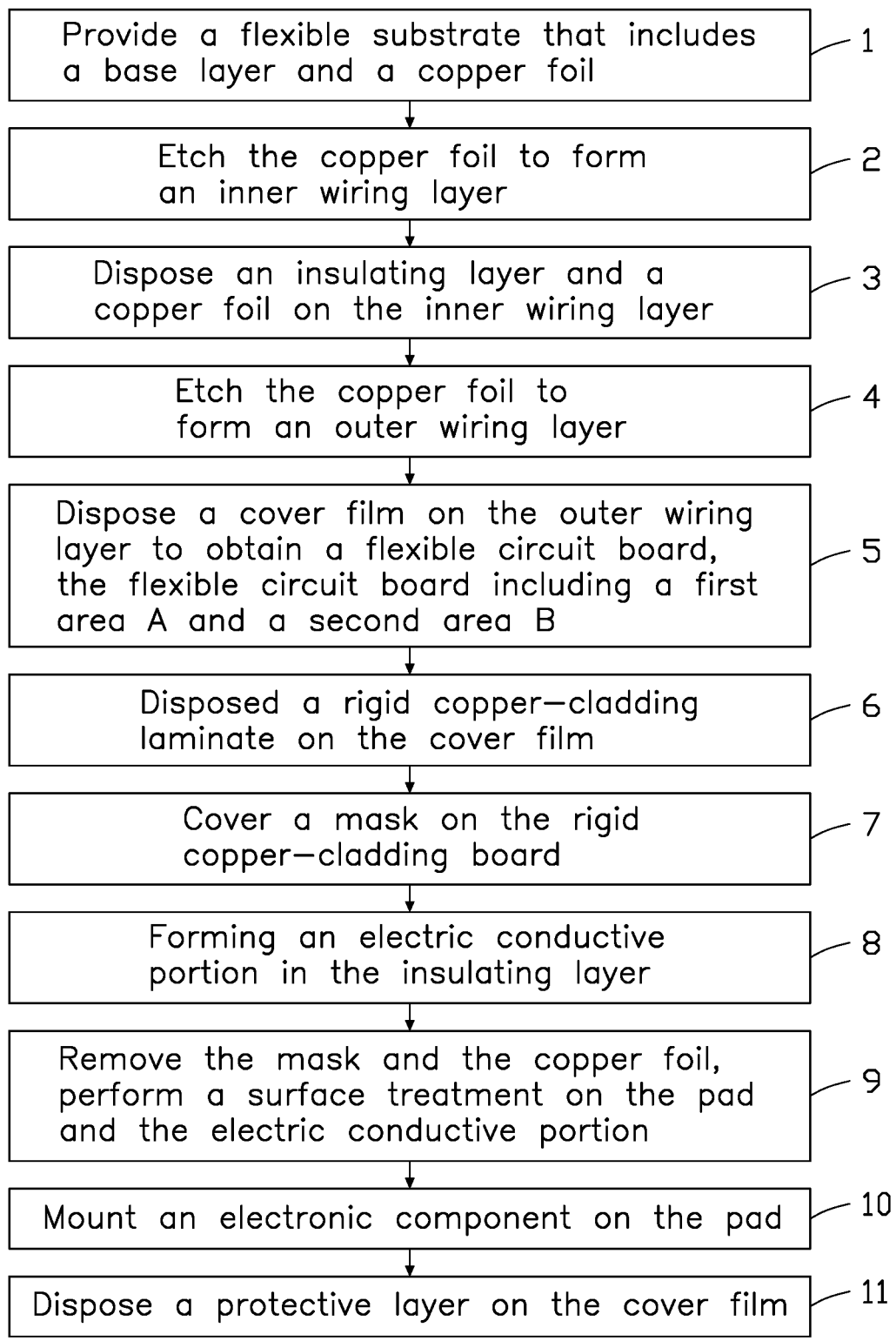
FIG. 13 is a flowchart of an embodiment of a method for manufacturing a fixing belt according to the present disclosure.

Referring to FIG. 13, a method for manufacturing a fixing belt of a wearable device is presented in accordance with an embodiment. The method is provided by way of example, as there are a variety of ways to carry out the method. The method can begin at block 1.

Figure 1:
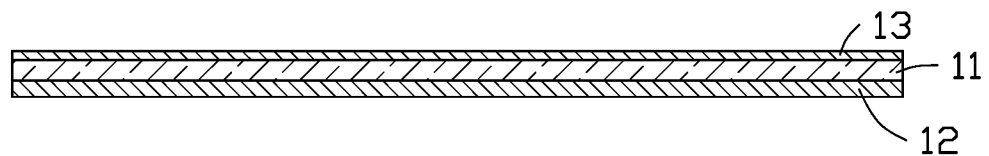
FIG. 1 is a cross-sectional view of an embodiment of a flexible substrate according to the present disclosure.

At block 1, referring to FIG. 1, a flexible substrate 10 is provided, which includes a base layer 11, and a first copper foil 12 and a second copper foil 13 disposed on two opposite surfaces of the base layer 11.

In some embodiments, the base layer 11 is made of an insulating resin. For example, the base layer 11 may be made of at least one of epoxy resin, polypropylene (PP), BT resin, and polyphenylene oxide (PPO), polyimide (PI), polyethylene terephthalate (PET), and polyethylene naphthalate (PEN).

Figure 2:
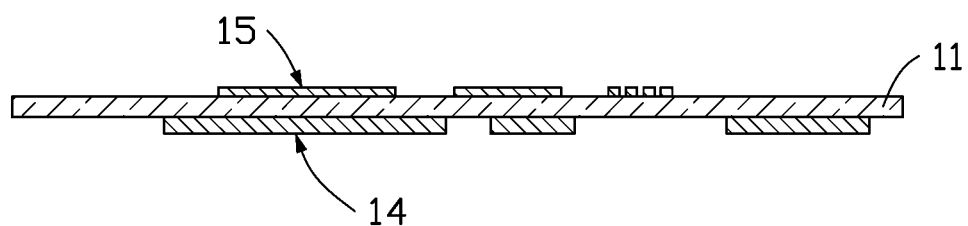
FIG. 2 is a cross-sectional view showing a copper foil of the flexible substrate of FIG. 1 etched to obtain the inner wiring layer.

At block 2, referring to FIG. 2, the first copper foil 12 and the second copper foil 13 are etched to form a first inner wiring layer 14 and a second inner wiring layer 15, respectively.

Figure 3:
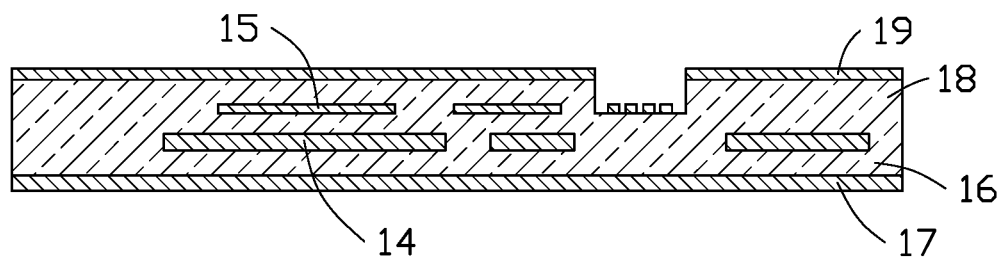
FIG. 3 is a cross-sectional view showing an insulating layer and a copper foil disposed on the inner wiring layer of FIG. 2.

At block 3, referring to FIG. 3, a first insulating layer 16 and a third copper foil 17 are disposed on the first inner wiring layer 14, and a second insulating layer 18 and a fourth copper foil 19 are disposed the second inner wiring layer 15.

Figure 4:
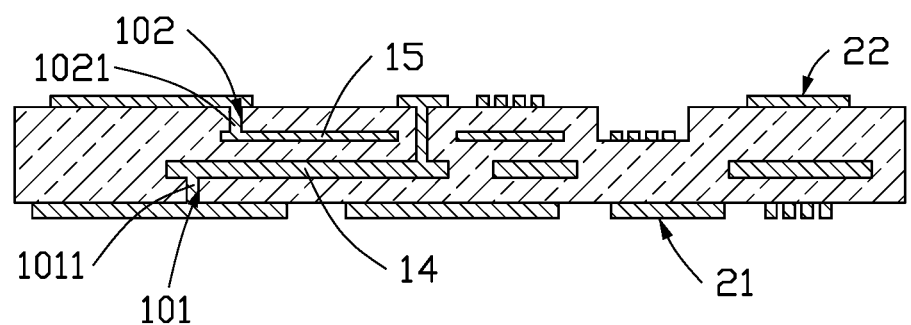
FIG. 4 is a cross-sectional view showing the copper foil of FIG. 3 etched to obtain an outer wiring layer.

At block 4, referring to FIG. 4, the third copper foil 17 and the fourth copper foil 19 are etched to form a first outer wiring layer 21 and a second outer wiring layer 22, respectively.

In some embodiments, before the third copper foil 17 and the fourth copper foil 19 are etched, a first through hole 101 is defined in the third copper foil 17 and the first insulating layer 16, a bottom of the first through hole 101 corresponds to the first inner wiring layer 14. A second through hole 102 is opened in the fourth copper foil 19 and the second insulating layer 18, and a bottom of the second through hole 102 corresponds to the second inner wiring layer 15. Then, copper is electroplated on the third copper foil 17 and the fourth copper foil 19, and a portion of the electroplated copper fills in the first through hole 101 and the second through hole 102, to form a first conductive portion 1011 and a second conductive portion 1021, respectively. The first outer wiring layer 21 is obtained by etching the third copper foil 17 and the copper electroplating layer on the third copper foil 17, and the second outer wiring layer 22 is obtained by etching the fourth copper foil 19 and the copper electroplating layer on the fourth copper foil. The first conductive portion 1011 can electrically connect the first outer wiring layer 21 to the first inner wiring layer 14, and the second conductive portion 1021 can electrically connect the second outer wiring layer 22 to the second inner wiring layer 15.

In some embodiments, the first through hole 101 and the second through hole 102 may be formed by punching or laser drilling.

In other embodiments, before forming the first outer wiring layer 21 and the second outer wiring layer 22, at least one intermediate wiring layer (not shown) may be formed on the first inner wiring layer 14 and the second inner wiring layer 15 by a build-up process. That is, the final number of the wiring layers of the fixed belt 100 (shown in FIG. 11) is not limited to four.

Figure 5:
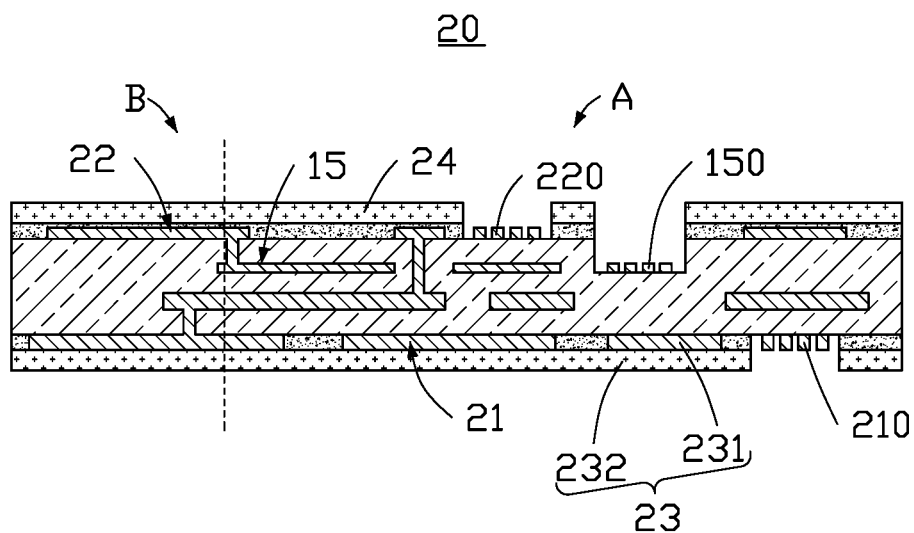
FIG. 5 is a cross-sectional view showing a cover film disposed on the outer wiring layer of FIG. 4 to obtain a flexible circuit board.

At block 5, referring to FIG. 5, a first cover film 23 and a second cover film 24 are disposed on the first outer wiring layer 21 and the second outer wiring layer 22, respectively, to obtain a flexible circuit board 20. The flexible circuit board 20 includes a first area A and a second area B connected to the first area A.

In some embodiments, the first outer wiring layer 21 includes a first pad 210 disposed in the first area A. The second inner wiring layer 15 includes a second pad 150 disposed in the first area A. The second outer wiring layer 22 includes a third pad 220 disposed in the first area A. The first pad 210 is exposed from the first cover film 23. Both the second pad 150 and the third pad 220 are exposed from the second cover film 24. The first pad 210, the second pad 150, and the third pad 220 are used for mounting electronic components in subsequent process.

In some embodiments, at least one of the first cover film 23 and the second cover film 24 includes a glue layer 231 and a cover layer 232 disposed on the glue layer 231. The glue layer 231 is disposed between the cover layer 232 and the first outer wiring layer 21 or the second outer wiring layer 22. The glue layer 231 also fills circuit gaps of the first outer wiring layer 21 or the second outer wiring layer 22.

Figure 6:
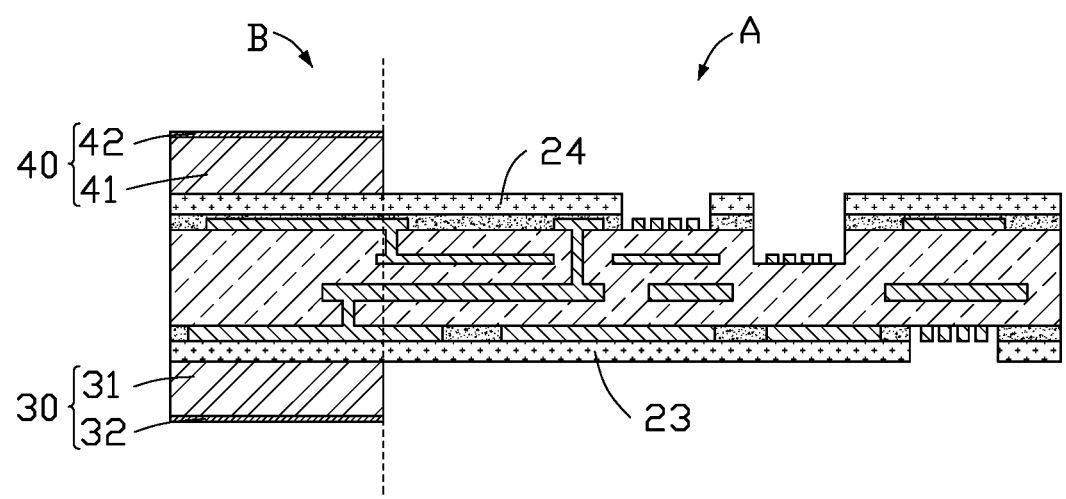
FIG. 6 is a cross-sectional view showing a rigid copper-cladding laminate disposed on the flexible circuit board of FIG. 5.

At block 6, referring to FIG. 6, a first rigid copper-cladding laminate 30 and a second rigid copper-cladding laminate 40 are disposed on the first cover film 23 and the second cover film 24, respectively. The first rigid copper-cladding laminate 30 and the second rigid copper-cladding laminate 40 are disposed in the second area B. That is, the first cover film 23 disposed in the first area A is not covered by the first rigid copper-cladding laminate 30, and the second cover film 24 disposed in the first area A is not covered by the second rigid copper-cladding laminate 40.

The first rigid copper-cladding laminate 30 includes a third insulating layer 31 and a fifth copper foil 32 disposed on the third insulating layer 31. The second rigid copper-cladding laminate 40 includes a fourth insulating layer 41 and a sixth copper foil 42 disposed on the fourth insulating layer 41.

Figure 7:
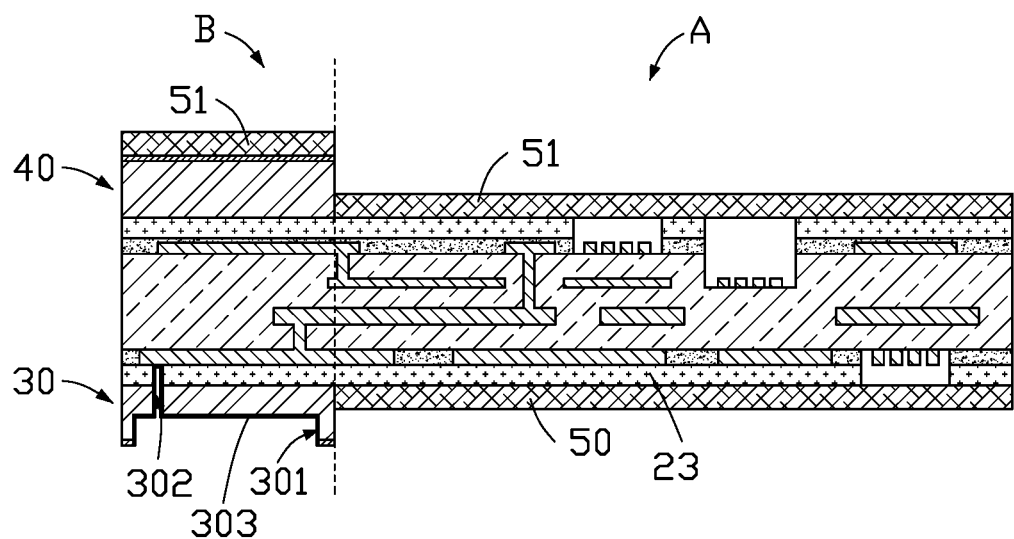
FIG. 7 is a cross-sectional view showing a mask disposed on the cover film of FIG. 6.

At block 7, referring to FIG. 7, a first mask 50 is covered on the first cover film 23 disposed in the first area A, leaving the first rigid copper-cladding laminate 30 to be exposed from the first mask 50. A second mask 51 is covered on the second rigid copper-cladding board 40 and the second cover film 24 disposed in the first area A.

Figure 8:
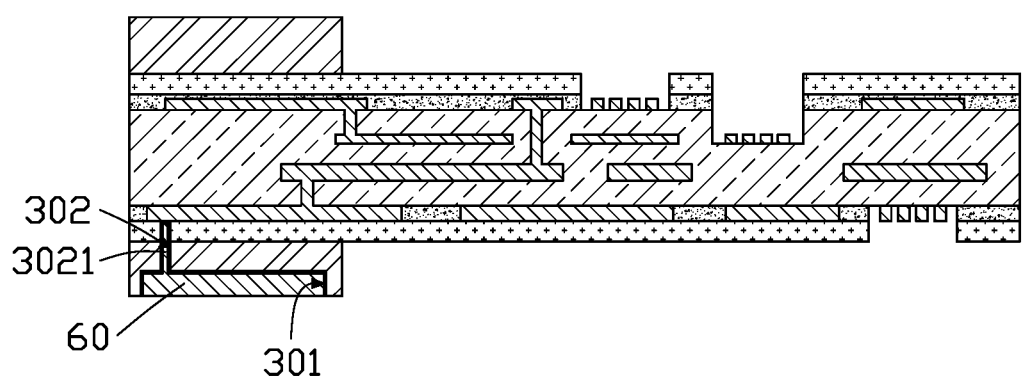
FIG. 8 is a cross-sectional view showing an electric conductive portion formed in the insulating layer of FIG. 7.

At block 8, referring to FIGS. 7 and 8, an electric conductive portion 60 for electrically connecting a device body 2 (shown in FIG. 12) is formed in the third insulating layer 31.

In some embodiments, the electric conductive portion 60 is golden fingers.

In some embodiments, as shown in FIG. 7, a groove 301 and a third through hole 302 are defined in the first rigid copper-cladding laminate 30. The groove 301 penetrates the fifth copper foil 32 and a portion of the third insulating layer 31. The third through hole 302 is disposed at a bottom of the groove 301, and further penetrates another portion of the third insulating layer 31 and the first cover film 23. A bottom of the third through hole 302 corresponds to the first outer wiring layer 21. Then, a seed layer 303 is formed on an inner sidewall and a bottom of the groove 301, and on an inner sidewall and a bottom of the third through hole 302. As shown in FIG. 8, copper is electroplated in the groove 301 and the third through hole 302 containing the seed layer 303. The copper electroplated in the groove 301 forms the electric conductive portion 60, and the copper electroplated in the third through hole 302 forms a third conductive portion 3021 for electrically connecting the electric conductive portion 60 to the first outer wiring layer 21. The seed layer 303 is used to improve an adhesion between the third insulating layer 31 and the electrically conductive portion 60 or the third conductive portion 3021.

Figure 9:
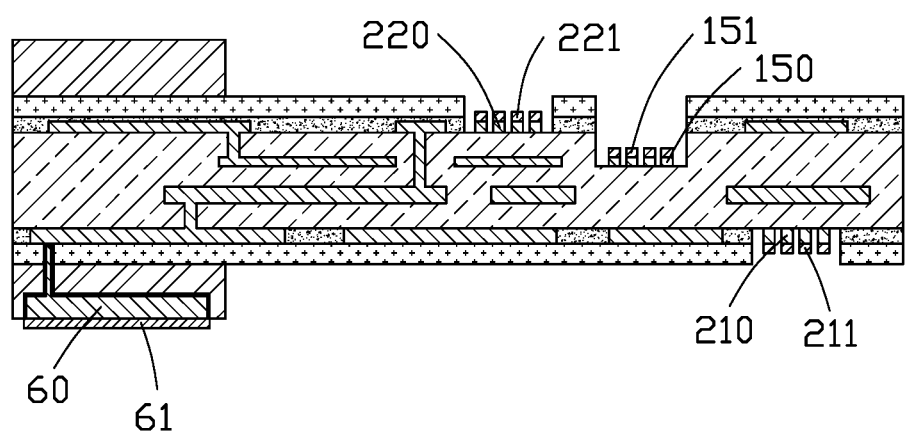
FIG. 9 is a cross-sectional view showing the mask of FIG. 8 removed and a surface treatment performed on a pad.

At block 9, referring to FIG. 9, the first mask 50 and the second mask 51 are removed, and the fifth copper foil 32 and the sixth copper foil 42 are also removed through a copper reduction process. Furthermore, surface treatment is performed on the first pad 210, the second pad 150, the third pad 220, and the electric conductive portion 60 to form a first surface treatment layer 211, a second surface treatment layer 151, a third surface treatment layer 221, and a fourth surface treatment layer 61, respectively.

The first surface treatment layer 211, the second surface treatment layer 151, the third surface treatment layer 221, and the fourth surface treatment layer 61 can prevent the surface of the corresponding pad or the electric conductive portion 60 from being oxidized. Each of the first surface treatment layer 211, the second surface treatment layer 151, the third surface treatment layer 221, and the fourth surface treatment layer 61 can be an electroless plating layer of gold or nickel, or an organic solder resist protective layer (OSP).

Figure 10:
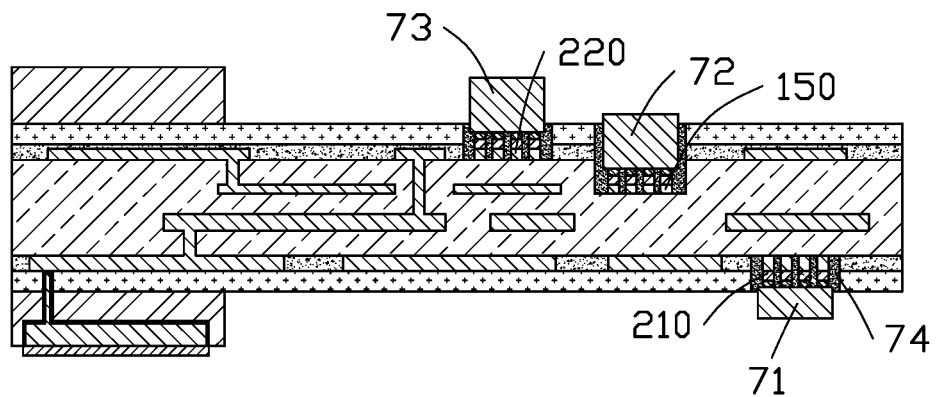
FIG. 10 is a cross-sectional view showing an electronic component mounted on the pad of FIG. 9.

At block 10, referring to FIG. 10, a first electronic component 71, a second electronic component 72, and a third electronic component 73 are mounted on the first pad 210, the second pad 150, and the third pad 220, respectively.

The number or the type of the electronic components are not limited, and can be set according to the functions required by the wearable device.

In some embodiments, a protective glue 74 can fill gaps between the first electronic component 71 and the first pad 210, between the second electronic component 72 and the second pad 150, and between the third electronic component 73 and the third pad 220. The protective glue 74 can further fix the first electronic component 71, the second electronic component 72, and the third electronic component 73 on the corresponding pads.

Figure 11:
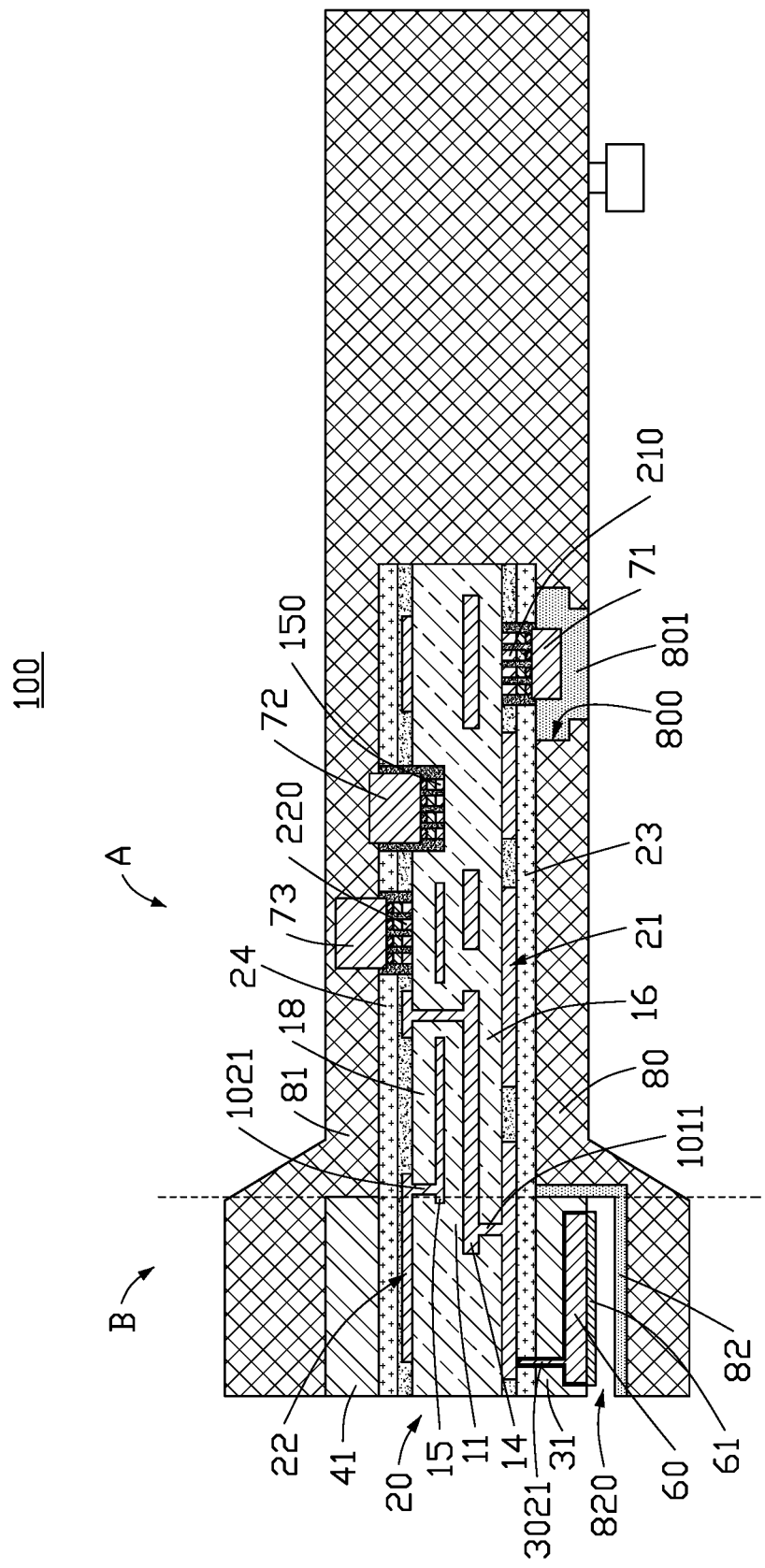
FIG. 11 is a cross-sectional view showing a protective layer disposed on the cover film of FIG. 10 to obtain a fixing belt.

At block 11, referring to FIG. 11, a first protective layer 80 and a second protective layer 81 are disposed on the first cover film 23 and the second cover film 24, respectively, causing the electric conductive portion 60 to be disposed between the first cover film 23 and the first protective layer 80, thereby obtaining the fixing belt 100.

A portion of the fixing belt 100 in the first area A constitutes a wearable area. Since the main body of the wearable area is the flexible circuit board 200, the texture of the wearable area is soft, so that the fixing belt 100 can be wrapped around a specific body part. A portion of the fixing belt 100 in the second area B constitutes a plug-in area. Since the plug-in area includes the third insulating layer 31 and the fourth insulating layer 41, the plug-in area can function as a hard board area that can engaged with the device body 2.

Figure 12:
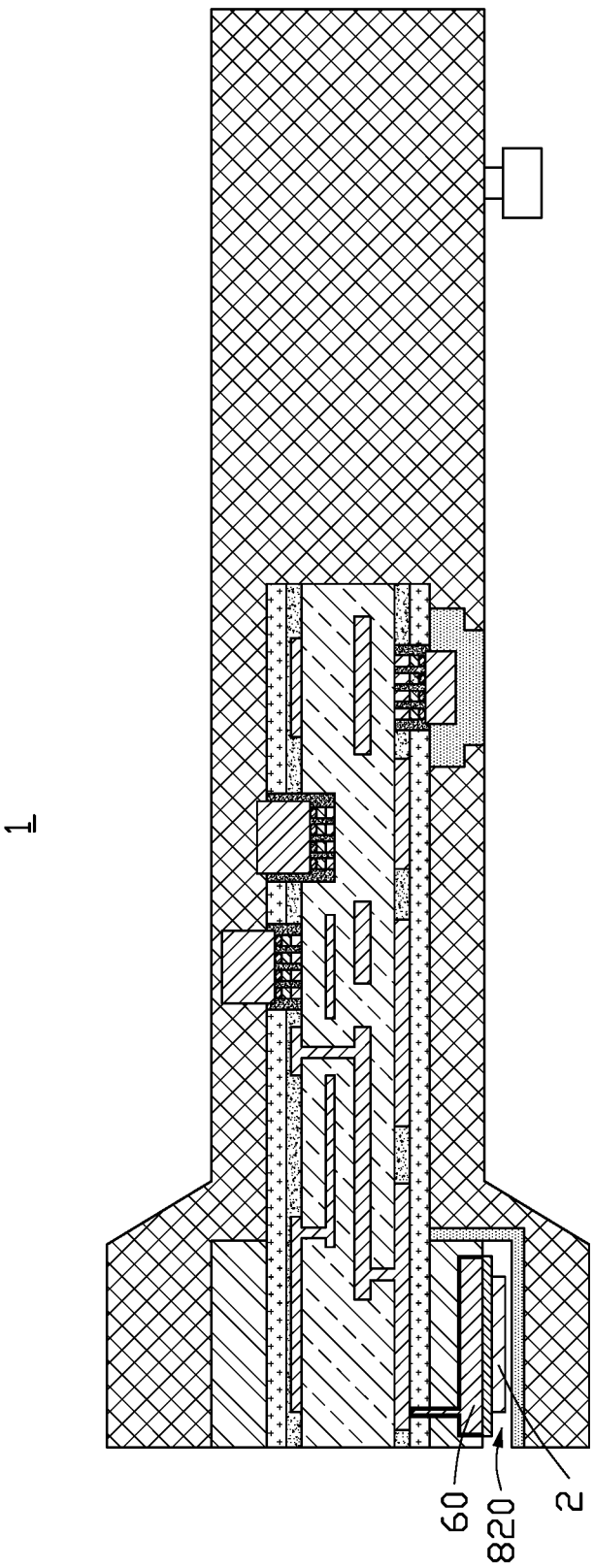
FIG. 12 is a cross-sectional view showing a device body inserted into the fixing belt of FIG. 11 to obtain a wearable device.

In some embodiments, before the first protective layer 80 and the second protective layer 81 are disposed, a support frame 82 can be covered on the third insulating layer 31. An insertion space 820 is defined between the support frame 82 and the third insulating layer 31, and the electric conductive portion 60 communicates with the insertion space 820. That is, the plug-in area includes the plug-in space 820. Referring to FIG. 12, when the fixing belt 100 and the device body 2 need to be assembled, the device body 2 can be plugged into the insertion space 820, so that the device body 2 is electrically connected to the electric conductive portion 60. Then, the wearable device is obtained.

The support frame 82 can be made of a material with a high hardness to provide a support function. For example, the support frame 82 may be made of a metal.

In other embodiments, the device body 2 may include the plugging space (not shown). Then, the fixing belt 100 may also be plugged into the plugging space of the device body 2.

In some embodiments, when the wearable device is worn around a predetermined body part (such as a wrist, at this time, the wearable device is a wristband), the first protective layer 80 faces the body part. The second protective layer 81 faces the ambient environment., that is, the second electronic component 72 and the third electronic component 73 face the body part. In some embodiments, the first electronic component 71 is a sensor for detecting physiological parameters (such as pulse, heart rate, or skin temperature) of the body part. The second electronic component 72 and the third electronic component 73 are sensors for detecting environmental information (such as illumination brightness and environmental noise level).

Furthermore, as shown in FIG. 11, the first protective layer 80 defines an window 800 for exposing the first electronic component 71. Therefore, the first electronic component 71 can detect the physiological parameters of the body part through the window 800. In some embodiments, after the first protective layer 80 is formed, a third protective layer 801 can be disposed in the window 800, which can prevent the first electronic component 71 from being damaged by an external force. The first protective layer 80 is made of a transparent material, so that the first electronic component 71 can detect the physiological parameters of the body part through the window 800. For example, the first protective layer 80 may be made of plastic or glass.

Referring to FIG. 11, an embodiment of a fixing belt 100 of a wearable device is also provided. The fixing belt 100 includes a flexible circuit board 20. The flexible circuit board 20 includes a base layer 11, and a first inner wiring layer 14 and a second inner wiring layer 15 disposed on two opposite surfaces of the base layer 11. A first insulating layer 16, a first outer wiring layer 21, and a first cover film 23 are disposed on the first inner wiring layer 14 in that order. A second insulating layer 18, a second outer wiring layer 22, and a second cover film 24 are disposed on the second inner wiring layer 15 in that order. The flexible circuit board 20 includes a first area A and a second area B connected to the first area A.

The fixing belt 100 further includes a third insulating layer 31 and a fourth insulating layer 41 disposed on the first cover film 23 and the second cover film 24, respectively. The third insulating layer 31 and the fourth insulating layer 41 are both disposed in the second area B. That is, the first cover film 23 in the first area A is not covered by the third insulating layer 31, and the second cover film 24 in the first area A is not covered by the fourth insulating layer 41. An electric conductive portion 60 is disposed in the third insulating layer 31. In some embodiments, the electric conductive portion 60 is golden fingers.

The fixing belt 100 further includes a first protective layer 80 and a second protective layer 81 disposed on the first cover film 23 and the second cover film 24, respectively. A portion of the fixing belt 100 in the first area A constitutes a wearable area. Since the main body of the wearable area is the flexible circuit board 200, the texture of the wearable area is soft, so that the fixing belt 100 can be wrapped around a specific body part. A portion of the fixing belt 100 in the second area B constitutes a plug-in area. Since the plug-in area includes the third insulating layer 31 and the fourth insulating layer 41, the plug-in area can function as a hard board area that can engaged with the device body 2.

In some embodiments, a support frame 82 is disposed on the third insulating layer 31, and between the first cover film 23 and the first protective layer 80. An insertion space 820 is defined between the support frame 82 and the third insulating layer 31, that is, the insertion area includes the insertion space 820. The device body 2 can be inserted into the insertion space 820, and electrically connects to the electric conductive portion 60.

In some embodiments, the first protective layer 80 defines a window 800 for exposing the first electronic component 71. Therefore, the first electronic component 71 can detect the physiological parameters of the body part through the window 800.

In some embodiments, a groove 301 and a third through hole 302 are defined in the third insulating layer 31. The groove 301 penetrates a portion of the third insulating layer 31. The third through hole 302 is disposed at a bottom of the groove 301, and further penetrates another portion of the third insulating layer 31 and the first cover film 23. A bottom of the third through hole 302 corresponds to the first outer wiring layer 21. An electric conductive portion 60 is disposed in the groove 301, and a third conductive portion 3021, which electrically connects the electric conductive portion 60 to the first outer wiring layer 21, is disposed in the third through hole 302.

In some embodiments, the first outer wiring layer 21 includes a first pad 210 disposed in the first area A. The first inner wiring layer 14 includes a second pad 150 disposed in the first area A. The second outer wiring layer 22 includes a third pad 220 disposed in the first area A. The first pad 210 is exposed from the first cover film 23. Both the second pad 150 and the third pad 220 are exposed from the second cover film 24. A first electronic component 71, a second electronic component 72, and a third electronic component 73 are mounted on the first pad 210, the second pad 150, and the third pad 220, respectively.

In some embodiments, a first through hole 101 is defined in the first outer wiring layer 21 and the first insulating layer 16, and a bottom of the first through hole 101 corresponds to the first inner wiring layer 14. A first conductive portion 1011, which electrically connects the first outer wiring layer 21 to the first inner wiring layer 14, is disposed in the first through hole 101. A second through hole 102 is defined in the second outer wiring layer 22 and the second insulating layer 18, and a bottom of the second through hole 102 corresponds to the second inner wiring layer 15. A second conductive portion 1021, which electrically connects the second outer wiring layer 22 to the second inner wiring layer 15, is disposed in the second through hole 102.

Referring to FIG. 12, an embodiment of a wearable device 1 is further provided. The wearable device 1 includes a device body 2 and the fixing belt 100. The device body 2 is inserted into the plug-in area of the fixing belt 100, and is electrically connected to the electric conductive portion 60.

The fixing belt 100 can integrate a plurality of electronic components in the portion of the fixing belt 100 containing the first area A. The portion of the fixing belt 100 containing the second area B can be detachably engaged with the device body 2. Therefore, the fixing belt 100 can not only be fixed to the body part, but also be installed with required electronic components. Thus, the wearable device 1 including the fixing belt 100 can be more multi-functional.

Although the embodiments of the present disclosure have been shown and described, those having ordinary skill in the art can understand that changes may be made within the principles of the present disclosure, up to and including the full extent established by the broad general meaning of the terms used in the claims. It will, therefore, be appreciated that the embodiments described above may be modified within the scope of the claims.

What is claimed is:

1. A method for manufacturing a fixing belt of a wearable device, comprising:
    providing a flexible circuit board comprising a first area, a second area, and at least one pad in the first area;
    disposing an insulating layer on the second area;
    forming an electric conductive portion in the insulating layer;
    disposing a first protective layer and a second protective layer on two opposite surfaces of the flexible circuit board, wherein the electric conductive portion is between the flexible circuit board and the first protective layer; and
    mounting at least one electronic component on the at least one pad to obtain the fixing belt, wherein a portion of the fixing belt containing the second area is a plug-in area, and the plug-in area is configured to be engaged with a device body of the wearable device, the electric conductive portion is disposed in the plug-in area;
    wherein the flexible circuit board comprises a base layer, a first inner wiring layer and a second inner wiring layer disposed on two opposite surfaces of the base layer, a first outer wiring layer and a first cover film are disposed on the first inner wiring layer in that order, a second outer wiring layer and a second cover film are disposed on the second inner wiring layer in that order, the first protective layer and the second protective layer are disposed on the first cover film and the second cover film, respectively.

2. The method of claim 1, wherein before the first protective layer is formed, the method further comprises:
    disposing a support frame on the insulating layer, an insertion space being defined between the support frame and the insulating layer, and the electric conductive portion communicating with the insertion space.

3. The method of claim 1, wherein the at least one pad comprises a first pad, the first outer wiring layer comprises the first pad, the first pad is exposed from the first cover film, and the at least one electronic component comprises a first electronic component mounted on the first pad.

4. The method of claim 3, wherein the first protective layer defines a window to expose the first electronic component, and a third protective layer is disposed in the window.

5. The method of claim 1, wherein the at least one pad comprises a second pad and a third pad, the first inner wiring layer comprises the second pad, the second outer wiring layer comprises the third pad, the second pad and the third pad are both exposed from the second cover film, and the at least one electronic component comprises a second electronic component and a third electronic component mounted on the second pad and the third pad, respectively.

6. The method of claim 1, wherein a groove is defined in a portion of the insulating layer, and the electric conductive portion is disposed in the groove; and
    a through hole is defined in a bottom of the groove, the through hole penetrates another portion of the insulating layer and the first cover film, a bottom of the through hole corresponds to the first outer wiring layer, and a conductive portion for electrically connects the electric conductive portion and the first outer wiring layer is disposed in the through hole.

7. The method of claim 1, wherein the electric conductive portion is gold fingers.

8. A fixing belt of a wearable device, comprising:
    a flexible circuit board comprising a first area, a second area, and at least one pad in the first area;
    an insulating layer disposed on the second area;
    an electric conductive portion disposed in the insulating layer;
    a first protective layer and a second protective layer disposed on two opposite surfaces of the flexible circuit board, respectively, wherein the electric conductive portion is between the flexible circuit board and the first protective layer; and
    at least one electronic component mounted on the at least one pad, wherein a portion of the fixing belt containing the second area is a plug-in area, and the plug-in area is configured to be engaged with a device body of the wearable device, the electric conductive portion is disposed in the plug-in area;
    wherein the flexible circuit board comprises a base layer, a first inner wiring layer and a second inner wiring layer disposed on two opposite surfaces of the base layer, a first outer wiring layer and a first cover film are disposed on the first inner wiring layer in that order, a second outer wiring layer and a second cover film are disposed on the second inner wiring layer in that order, the first protective layer and the second protective layer are disposed on the first cover film and the second cover film, respectively.

9. The fixing belt of claim 8, wherein a support frame is disposed on the insulating layer, an insertion space being defined between the support frame and the insulating layer, and the electric conductive portion communicating with the insertion space.

10. The fixing belt of claim 8, wherein the at least one pad comprises a first pad, the first outer wiring layer comprises the first pad, the first pad is exposed from the first cover film, and the at least one electronic component comprises a first electronic component mounted on the first pad.

11. The fixing belt of claim 10, wherein the first protective layer defines a window to expose the first electronic component, and a third protective layer is disposed in the window.

12. The fixing belt of claim 8, wherein the at least one pad comprises a second pad and a third pad, the first inner wiring layer comprises the second pad, the second outer wiring layer comprises the third pad, the second pad and the third pad are both exposed from the second cover film, and the at least one electronic component comprises a second electronic component and a third electronic component mounted on the second pad and the third pad, respectively.

13. The fixing belt of claim 8, wherein a groove is defined in a portion of the insulating layer, and the electric conductive portion is disposed in the groove; and
   a through hole is defined in a bottom of the groove, the through hole penetrates another portion of the insulating layer and the first cover film, a bottom of the through hole corresponds to the first outer wiring layer, and a conductive portion for electrically connects the electric conductive portion and the first outer wiring layer is disposed in the through hole.

14. The fixing belt of claim 8, wherein the electric conductive portion is gold fingers.

15. A wearable device comprising:
   a device body; and
   a fixing belt comprising:
      a flexible circuit board comprising a first area, a second area, and at least one pad in the first area;
      an insulating layer disposed on the second area;
      an electric conductive portion disposed in the insulating layer;
      a first protective layer and a second protective layer disposed on two opposite surfaces of the flexible circuit board, respectively, wherein the electric conductive portion is between the flexible circuit board and the first protective layer; and
      at least one electronic component mounted on the at least one pad, wherein a portion of the fixing belt containing the second area is a plug-in area, and the plug-in area is configured to be engaged with the device body and electrically connects to the electric conductive portion;
   wherein the flexible circuit board comprises a base layer, a first inner wiring layer and a second inner wiring layer disposed on two opposite surfaces of the base layer, a first outer wiring layer and a first cover film are disposed on the first inner wiring layer in that order, a second outer wiring layer and a second cover film are disposed on the second inner wiring layer in that order, the first protective layer and the second protective layer are disposed on the first cover film and the second cover film, respectively.

\* \* \* \* \*